United States Patent [19]
Lenling

[11] Patent Number: 6,099,974
[45] Date of Patent: *Aug. 8, 2000

[54] COATING THAT ENABLES SOLDERING TO NON-SOLDERABLE SURFACES

[75] Inventor: William J. Lenling, Madison, Wis.

[73] Assignee: Thermal Spray Technologies, Inc., Sun Prairie, Wis.

[ * ] Notice: This patent issued on a continued prosecution application filed under 37 CFR 1.53(d), and is subject to the twenty year patent term provisions of 35 U.S.C. 154(a)(2).

[21] Appl. No.: 08/895,129

[22] Filed: Jul. 16, 1997

[51] Int. Cl.[7] .............................. B22F 7/00; B32B 15/01; B32B 15/20; B32B 15/04
[52] U.S. Cl. .................. 428/548; 428/646; 428/647; 428/648; 428/674; 428/680; 428/357; 427/191; 427/192; 427/201
[58] Field of Search ...................... 428/548, 647, 428/646, 648, 674, 680, 937, 557, 357; 427/576, 455, 191, 192, 201; 75/247, 245

[56] References Cited

U.S. PATENT DOCUMENTS

| | | |
|---|---|---|
| 3,676,211 | 7/1972 | Kourtesis et al. ............ 117/212 |
| 4,130,854 | 12/1978 | Hertz .......................... 361/304 |
| 4,230,748 | 10/1980 | Patel .......................... 427/423 |
| 4,341,816 | 7/1982 | Lauterbach et al. ......... 427/34 |
| 4,542,401 | 9/1985 | Sekiba ........................ 357/71 |
| 5,026,599 | 6/1991 | Koskenmaki ............... 428/328 |
| 5,217,746 | 6/1993 | Lenling et al. .............. 427/450 |
| 5,559,677 | 9/1996 | Errichiello ................... 361/816 |
| 5,714,700 | 2/1998 | Nishida et al. .............. 75/231 |
| 5,716,713 | 2/1998 | Zsamboky et al. .......... 428/457 |

*Primary Examiner*—Paul Thibodeau
*Assistant Examiner*—Holly C Rickman
*Attorney, Agent, or Firm*—Foley & Lardner

[57] ABSTRACT

A composite coating provides a solderable surface on materials that cannot otherwise be soldered. The solderable coating is comprised of a composite layer of two components made of metals or metal alloys that function as a solderable material and as a material that enhances solder flow. A thin layer of at least one of the two components can also be incorporated along with the composite layer. A solderable coating can be deposited on a non-solderable surface by any of a variety of thermal spray techniques, including plasma spraying or wire arc spraying. These solderable coatings are particularly useful in the manufacturing of high power electronic components.

11 Claims, 2 Drawing Sheets

COATING THAT ENABLES SOLDERING TO NON-SOLDERABLE SURFACES

BACKGROUND OF THE INVENTION

1. Field of the Invention

The present invention relates to compositions coated onto a base material to provide a surface for soldering and to methods for applying a solderable coating to a non-solderable surface.

2. Related Art

The ability to solder parts that have non-solderable surfaces is of particular importance to the electronic manufacturing industry. This problem often arises, for example, in the bonding of high power electronic devices to heat sinks. Although a copper heat sink can be soldered to another component, copper heat sinks have several disadvantages, including a high density and a high thermal expansion coefficient which greatly differs from the typically low thermal expansion coefficient of electronic components. This mismatch in thermal expansion coefficients of an electronic device and a copper heat sink can lead to stress in the components, as well as failure when the device heats during operation. Therefore, it is desirable to use a material other than copper for the heat sink.

Heat sinks can also be composed of materials such as aluminum, graphite, and composite materials. These non-copper heat sinks can be bonded to an electronic device using approaches such as thermally conductive adhesives. Soldering is generally preferred because it provides a very strong bond and excellent thermal conductivity. However, soldering requires the deposit of a solderable coating on the surface of most heat sink materials other than copper. For example, materials such as gold, nickel, silver and copper can be coated on such non-copper heat sinks by a plating process to provide a solderable surface. Plating processes, however, can be expensive and environmentally unsafe.

The processes of thermal spraying are capable of producing coatings on a large variety of materials. Thermal spraying can be performed in an environmentally safe manner. The process of thermal spraying involves injecting powder, wire or rod materials into a high temperature heat source such that the material is melted and atomized, and then sprayed onto a prepared surface, where the material solidifies to create a coating. Materials commonly deposited with thermal spraying include metals, ceramics, carbides, and plastics. The coatings produced are used to provide properties such as wear resistance, electrical insulation, corrosion protection and protection from high temperatures. The common processes of thermal spraying include plasma spraying, flame spraying, wire arc spraying, and high velocity oxy-fuel (HVOF) spraying. U.S. Pat. No. 4,341,816 to Lauterback, et al. describes the use of plasma spraying processes to apply a first, adhesive, layer to a generally non-solderable target body for a sputtering system, and to apply a second, solderable, layer over the adhesive layer. The coated surface of the target is then soldered to a metal cooling plate. The need to apply at least two separate layers using separate plasma spraying steps makes such a process more costly for larger scale production than a single layer process, such as for the attachment of electronic components to heat sinks.

SUMMARY OF THE INVENTION

The present invention provides a solderable coating that can be applied to a surface in a single layer by thermal spraying. The invention also provides methods for depositing a solderable coating on a non-solderable surface using a single thermal spraying step.

The coating in accordance with the present invention may be applied in a single layer utilizing a thermal spraying process. The two components that will comprise the layer are provided to the thermal spraying equipment and are reduced to a mixture of small discrete particles, which may be fully liquid or solid particles with liquified or softened surfaces. The mixture of particles, in which each of the components is retained in the form of individual discrete particles rather than being alloyed or reacted with the other component, is deposited in a layer onto the surface of the normally non-solderable base material. The base may be a heat sink formed of a material which normally cannot be readily or feasibly soldered to electronic components. When the individual discrete particles are deposited, they retain their discrete characteristics, with each particle being comprised either of the first component or the second component, but generally not both. However, the particles contact each other in the layer and, as the particles cool and their surfaces solidify, the particles are firmly adhered together in a layer and are adhered to the surface of the base material. Consequently, a very strong, cohesive, and strongly adhering coating layer is provided.

In the present invention, the first component may be selected from metal such as copper, copper alloys, and nickel, which are materials that are readily solderable, and the second component may be a metal, such as tin or tin alloy, which serves to facilitate flow of solder.

The present invention thus yields a coating on a normally non-solderable material that can be applied in a single thermal spraying step, rather than requiring multiple steps or multiple layers, thereby providing efficient and cost effective production. Because the coating retains discrete particles of the individual components, rather than alloys of the individual components, each individual component retains its desirable functional characteristics for subsequent soldering steps. For example, the first component, which may be formed of copper or other solderable metals, has a much higher melting point than and is wettable by the solder, allowing the solder to form a uniform layer over the coating, while the second discrete component, which preferably has a melting point higher than but close to that of the solder, facilitates the flow of such solder and can melt and mix with conventional solders to further enhance the bond between the solder itself and the coating.

After the coating has been applied to the substrate base material, a solder paste or solder preform may then be applied to the coated surface and, if required, a solder flux may also be supplied. The component or the surface with the solder formed thereon may be heated to the melting point of the solder, which melts and flows over the surface and wets the surface to create a metallurgical bond to the coating. In one process, electronic components may be directly engaged to the solder as it is initially liquified, with subsequent cooling of the solder then resulting in a bond between the electronic components and the solder coated base substrate.

Further objects, features and advantages of the invention will be apparent from the following detailed description when taken in conjunction with the accompanying drawings.

DETAILED DESCRIPTION OF THE INVENTION

As described herein, a solderable coating is produced from a solderable material and a material that improves solder flow. These materials are referred to as the first component and second component, respectively, of the solderable coating. The function of the first component in the coating is to provide a high melting point material in the coating which the solder preform or paste will wet. The function of the second component is to enable the solder preform or paste to flow over the coating surface while the preform or paste is molten.

The solderable material, or first component, is a metal or metal alloy. Suitable solderable materials include copper, nickel, and copper alloys. Copper and nickel are preferred solderable materials. The solder flow enhancing material, or second component, also a metal or metal alloy, has a low melting point temperature compared with the first component. Preferably, the second component will have a melting point that is slightly higher than that of the solder to be used (e.g., within about 30° C.). Suitable materials for the second component include tin and a babbitt metal. Such babbitt metals include any of several tin- or lead-based alloys, such as: (1) a high-tin alloy with small quantities of antimony and copper, (2) a high-lead alloy containing antimony, arsenic and tin, and (3) an intermediate tin-alloy with antimony and copper. Tin and tin alloys are preferred materials for the solder flow enhancing component.

As described below, the two components of the solderable coating are deposited on a non-solderable (or poorly solderable) surface of a substrate to create a coating that, on a microstructural level, consists of the two separately identifiable components. That is, there is little or no chemical reaction or metallurgical mixing (alloying) of the two components in the coating structure. Both materials can be identified in the same layer of the coating structure by metallurgical analysis. Such a layer that contains the two identifiable components of the solderable coating is referred to as a "composite layer."

Figure 1:
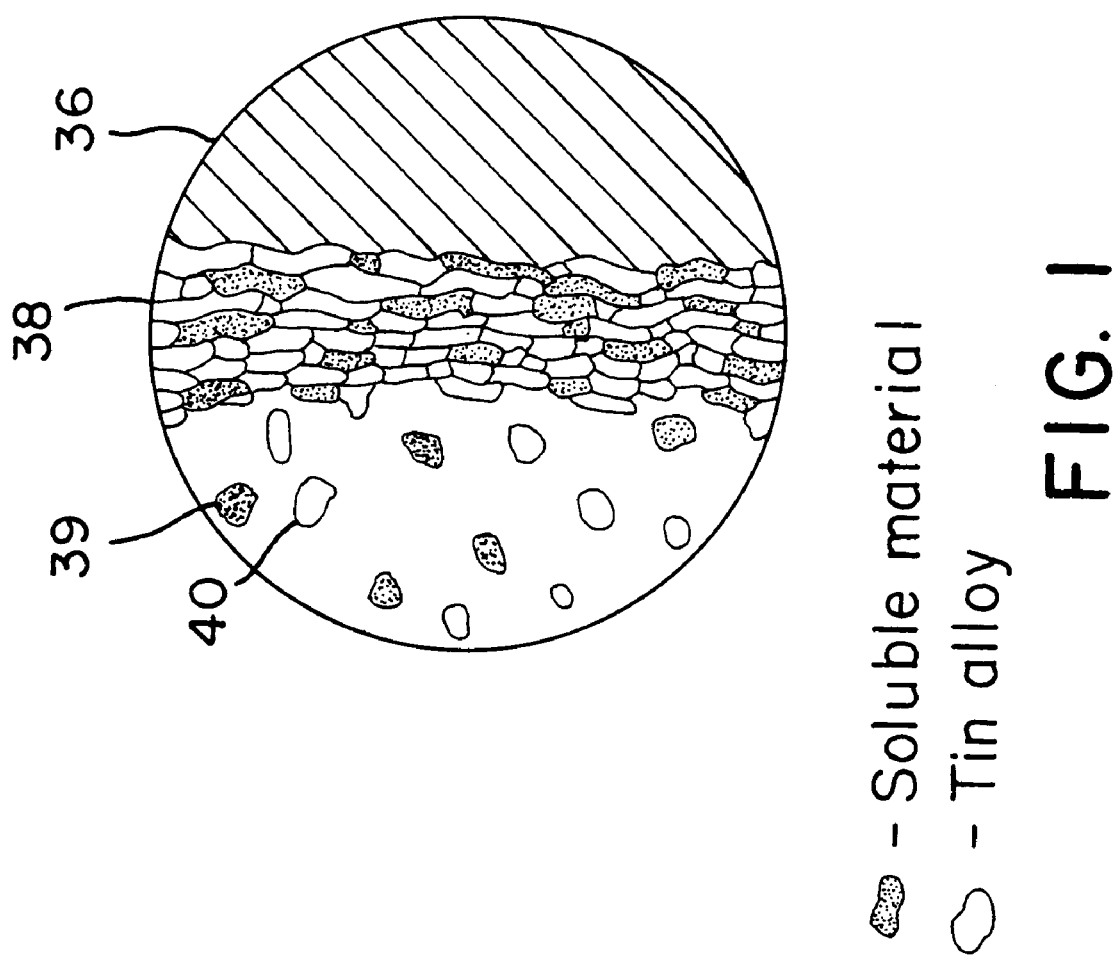
FIG. 1 is an illustrative view of a microstructural cross-section of the composite layer of a solderable coating in accordance with the invention.

FIG. 1 shows a microstructural cross-section of a solderable coating 38, which is comprised of the distinct components as discrete particles 39 and 40 deposited on the base material 36. As the discrete particles 39 and 40 are deposited, they contact and adhere to adjacent particles as the particles harden, but without significant alloying of individual particles. As used herein, "particles" is intended to refer to individual small drops of fully liquified metal and to small pieces of solid metal that are sufficiently heated so that the surfaces of the pieces, at least, may be softened or liquified so that the individual particles will adhere together in the coating and to the substrate surface as the deposited particles cool. As shown in the figure, the solderable coating is comprised of a distinct composite layer of the two components. Identification of the composite layer can be accomplished by cross-sectioning the coating, polishing the coating, and examining the coating with a light microscope.

Typically, the composite layer of a solderable coating in accordance with the invention contains 10–80% by volume of solderable material and 20–90% by volume of the solder flow enhancing component. Moreover, the composite layer will typically have a thickness of about 0.001 to 0.005 inches, although thicker layers also provide a suitable solderable coating. The particular composition of a solderable coating will depend on the desired conditions of the soldering operation.

In addition to a composite layer, the solderable coating of the invention also can contain one or two distinct layers of either a solderable material or a solder flow enhancing material. Such a layer of either component can be deposited on the surface of the base material before or after deposition of the composite layer. Moreover, a solderable coating can comprise a layer of either component adhered to and residing above and below the composite layer. Preferably, the solderable coating comprises a layer of a tin alloy (babbitt metal) at the coating surface. Although a thin layer of each component can also be identifiable in the coating structure, a composite layer of both components must be present in the coating structure of the present invention.

Although solderable coatings can be deposited on a non-solderable surface of a substrate using various standard methods, a preferred method for applying a composite solderable coating in the present invention is thermal spraying. In the thermal spraying process, a heat source in the thermal spray device melts powder, wire or rod material comprising the coating components. The coating components are fed through injection ports into the heat source of the thermal spray system, which may be a plasma arc, electric arc, or flame. The coating components are then melted and sprayed onto the non-solderable surface where the materials solidify to create the solderable coating. Standard thermal spray processes include plasma spraying, wire arc spraying, flame spraying, and high velocity oxygen fuel spraying.

Figure 2:
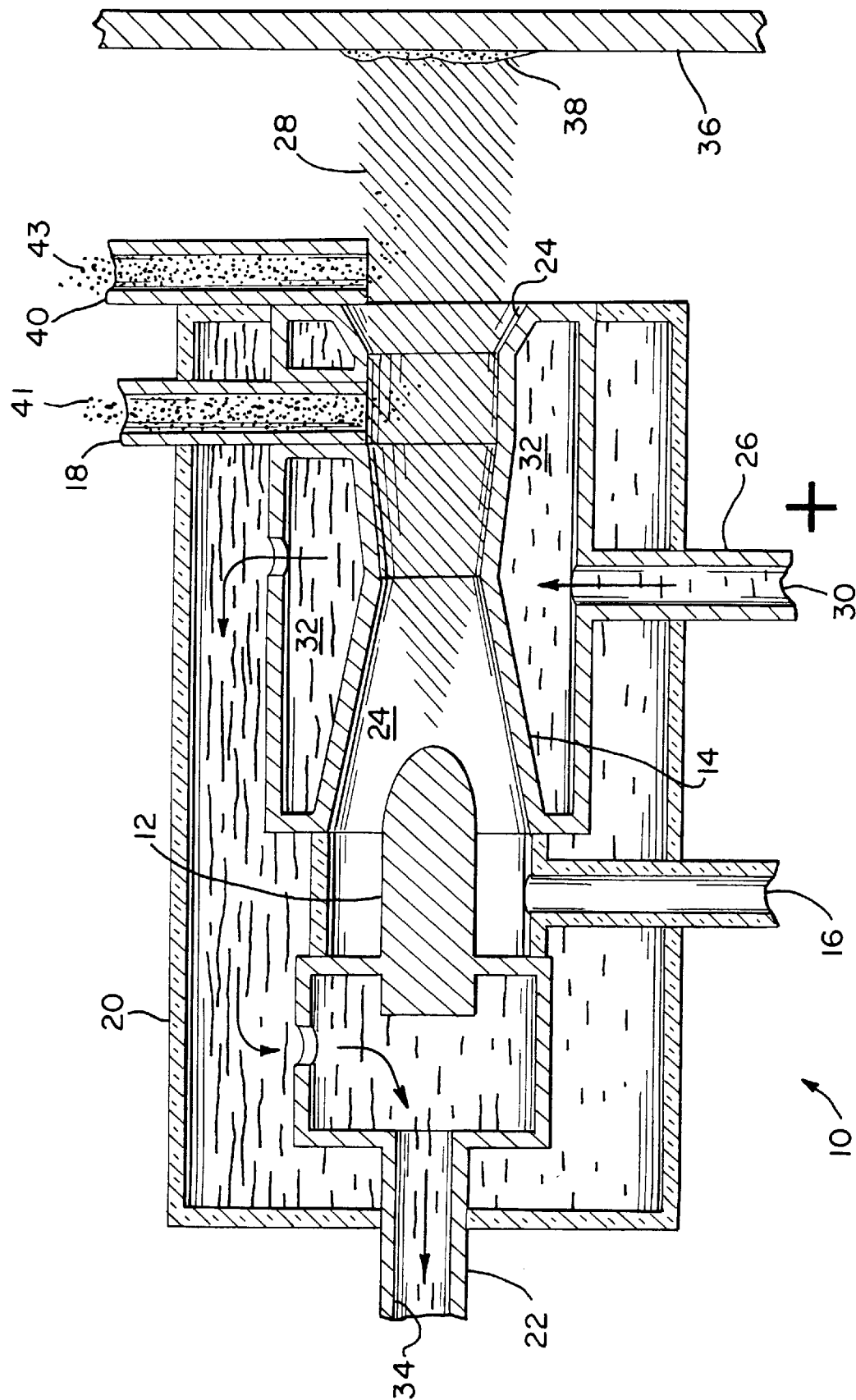
FIG. 2 is a simplified cross-sectional view of a plasma gun suitable for depositing a solderable coating in accordance with the invention.

As an illustration, FIG. 2 shows a device suitable for production of a solderable coating by plasma spraying. An example of a suitable thermal spray apparatus and process is set forth in the U.S. patent to Lenling, et al., U.S. Pat. No. 5,217,746 (1993), incorporated herein by reference. The plasma gun 10 comprises a cathode 12, an anode 14, an arc gas inlet 16, and a powder injection port 18. These components are arranged within an insulating housing 20. Typically, a pointed or conical cathode 12 is positioned in the rear of the plasma gun 10, and the cathode is connected to a negative electrical connection 22. The cathode is maintained at a negative electrical potential during operation of the plasma gun. The anode 14 is usually positioned at the front of the plasma gun, and it is shaped to define an open-ended chamber 24. The anode 14 is connected to a positive electrical connection 26 and is maintained at a positive electrical potential during operation of the plasma gun.

The arc gas inlet 16 is in communication with the open-ended chamber 24. A suitable pressurized arc gas is introduced into the arc gas inlet 16, resulting in the formation of an arc from the electrical current crossing the gap between the cathode 12 and the anode 14. A plasma 28 is formed with a plasma axis running from the cathode 12 to the surface to be coated 36. The cathode 12 represents the upstream direction along the plasma axis and the surface 36 represents the downstream direction. Generally, temperatures within the plasma decrease farther downstream along the plasma axis.

The plasma 28 results in a zone of intense heat that begins at the tip of the cathode 12 and extends through and emanates from the open-ended chamber 24. The magnitude of the heat in the plasma flame 28 is dependent on the current applied between the cathode 12 and the anode 14 and the choice of arc gas. Because of the intense heat generated by the plasma gun 10, the parts typically are water-cooled. Water enters through a water inlet 30, flows through a passageway 32 in the anode 14, is routed through the housing 20, and exits at a water outlet.

The coating 38 is formed from a material that is, for example, in powder form. The powder is metered by a powder feeder or hopper and is introduced into a suitable carrier gas that suspends and feeds the material to the plasma 28 through the powder injection port 18. The plasma 28 heats the powder into a molten or semi-molten state and the powder is propelled to impinge upon a base material part 36 to form the coating 38 thereon. The open-ended chamber 24 is shaped as a nozzle through which the plasma 28 exits and the molten material contained therein is projected onto the base material part 36. A bond is produced at the interface between the base metal part 36 and the coating 38 as the particles cool and fully solidify. FIG. 1 illustrates the deposition of the coating on the base material part.

The heat of the plasma 28 is adjusted, depending on the powder used to form the coating 38, so that the heat is sufficient to melt the powder into an appropriately molten or plastic state. In producing a coating 38 upon a base material part 36, operating conditions are controlled by regulating the power level between the cathode and anode, the pressure and flow rate of the arc gas, the flow rate of the carrier gas, the powder feed rate (i.e., the quantity of powder introduced into the arc per unit time), and the cooling water flow.

In the method of the present invention, a second injection port 40 can be employed, which is located downstream of the first port 18. The first injection port 18 is used to introduce a solderable material, such as powdered copper 41, which is carried by a carrier gas into the plasma 28. In the second injection port 40, a lower melting point material, such as a tin alloy, can be injected in powder form and carried by a carrier gas into the plasma 28. Injecting the two components at different locations allows optimization of the heat input for each component to provide proper melting with minimal over-heating.

The concentrations of the two components injected at the first and second ports 18 and 40 may be altered by changing the powder feed rates. In the above example, the second injection port is located outside the housing 20, although this does not necessarily have to be the case. The second injection port 40 can also be located within the housing, or both injection ports may be located outside the housing.

Although the solderable coating can be produced by injecting the two components at separate locations in a thermal spray device, those of skill in the art will recognize various options. For example, the two components can be premixed to a desired coating composition before introducing the components into the device through a single injection port. The blended materials are then melted by a thermal sprayer device, mixed in the spray stream, and co-deposited to create the composite layer of the solderable coating.

The coating of the present invention can be applied to various non-solderable surfaces. For example, a coating can be deposited on a substrate such as a heat sink made of aluminum, graphite, plastic or other normally non-solderable materials. Such a heat sink having a coating as described herein can then be readily soldered to an electronic device.

A part having a solderable coating is soldered to another surface using standard methods of soldering. For example, a solder paste or solder preform is applied to the solderable coating and if required, a solder flux is also applied. The component having the solderable surface is then heated to the melting point of the solder. When the solder melts, it flows over the surface and wets the coating to create a metallurgical bond to the coating.

Typically, the second component will have a melting point slightly higher than that of the solder. For example, a common babbit metal that can be used has a solidus temperature of 230° C. (liquidus about 354° C.), whereas 60% tin, 40% lead solders typically have a melting point in the range of 180° to 225° C.

The present invention, thus generally described, will be understood more readily by reference to the following examples, which are provided by way of illustration and are not intended to be limiting of the present invention.

EXAMPLES

A powder of solderable material containing 99.5% copper, and having a particle size ranging from 10 microns in diameter to 44 microns in diameter, was internally injected into a Miller Thermal SG-100 plasma spray gun equipped with a Mach II anode, cathode, and gas injector such as the device shown in FIG. 2. Two Miller Thermal powder hoppers were used, one containing copper and the other a tin alloy. The copper powder was injected at a rate of 36 grams/minute and sprayed at 29.9 kW of DC power. Simultaneously, a solder flow enhancing material in powder form was externally injected into the plasma. This second component, a tin alloy, contained 88% tin, 8% antimony, and 4% copper, and the powder had a particle size distribution of 10 microns in diameter to 90 microns in diameter. The tin alloy powder was injected at 54 grams/minute. The resultant composite layer of the solderable coating contained about 39% copper by volume and 61% tin alloy by volume.

Testing of the coating is accomplished by heating the coated element to 220–240° C. A mildly reactive (RMA) flux is applied to the coating where soldering is to take place. A solder preform comprised of 60% tin and 40% lead is placed on the coating and is melted. While the solder is in the molten state, it flows over the surface and wets the coating. The absence of solder lumping along with good solder flow indicates that the coating has been soldered properly.

A 60/40 lead/tin preform was placed on a coated part that was treated with an RMA flux and heated to 180–225° C. The solder melted and flowed across the surface, demonstrating good wetting to the coating.

In another example, similar equipment and materials are used. The equipment used to produce the solderable coating includes: A Miller Thermal SG-100 plasma spray gun that is set up with a standard Mach II set-up, including a Mach II anode, cathode and gas injector. Two Miller Thermal powder hoppers are used, one containing copper and the other containing a tin alloy (88% Sn, 8% Sb, 4% Cu). The particle size distribution of the copper alloy is −44+10 (maximum 44 and minimum 10) microns, and the tin alloy is −75+38 microns. The copper powder is internally injected into the plasma and the tin alloy is externally injected into the plasma. The feed rates of the powders are 29 g/min. copper, and 54 g/min. tin alloy. The powder feed gas pressures are 80 psi copper and 80 psi tin alloy. The net energy the gun operates at is 31.2 kW. This energy is produced by mixing argon and helium with gas pressures of 90 psi argon and 60 psi helium. A surface is coated with the plasma gun traversing across the surface at 1200 in./min. and a step increment of 0.25 in. A total of one sweep across the surface is required.

After the part is coated, it can then be soldered to using a 60/40 Sn/Pb solder with a mildly reactive flux. The solder surface should be heated to 225° C. to 275° C. for good soldering to occur.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention, which is defined by the following claims.

What is claimed is:

1. A solderable coating formed on a surface of a substrate that is normally difficult to solder by tin alloy solder comprising:

a composite layer of two components formed on and adhered to a surface of the substrate, wherein the first component is a solderable material that has a higher melting point than and is wettable by the solder and the second component is a material that enhances solder flow and that has a lower melting point than the first component that is higher than that of the solder, and wherein the first component and the second component are made of metal or a metal alloy, and wherein the components are formed of discrete particles of the material forming each component mixed together and adhered to each other by melting and solidification of at least the surfaces of the particles such that on a microstructural level there are two separately identifiable components, to form a cohesive and adhering coating layer.

2. The solderable coating of claim 1, wherein the composite layer of the coating comprises 10–80% of the first component by volume and 20–90% of the second component by volume.

3. The solderable coating of claim 2, wherein the first component is selected from the group consisting of copper, copper alloy, and nickel, and wherein the second component is tin or a tin alloy.

4. The solderable coating of claim 3, wherein the first component is copper, and wherein the second component is a tin alloy.

5. The solderable coating of claim 1, further comprising an additional layer of either the first component or the second component formed on the composite layer.

6. The solderable coating of claim 1, further comprising a layer of either the first component or the second component adhered to and residing above and below the composite layer.

7. A solderable coating formed on a surface of a substrate that is normally difficult to solder by tin alloy solder comprising:

a composite layer of two components formed on and adhered to a surface of the substrate, wherein the first component is a solderable material selected from the group consisting of copper, copper alloy and nickel and that has a higher melting point than and is wettable by the solder, and the second component is tin or a tin alloy and that enhances solder flow and that has a lower melting point than the first component that is higher than that of the solder, and wherein the components are formed of discrete particles of the material forming each component mixed together and adhered to each other by melting and solidification of at least the surfaces of the particles such that on a microstructural level there are two separately identifiable components to form a cohesive and adhering coating layer.

8. The solderable coating of claim 7, wherein the composite layer of the coating comprises 10–80% by volume of the first component and 20–90% by volume of the second component.

9. The solderable coating of claim 7, wherein the first component is copper and the second component is a tin alloy.

10. A structure having a surface that is solderable by a tin alloy solder, comprising:

a substrate formed of a material selected from the group consisting of aluminum, graphite and plastic;

a composite layer of two components formed on and adhered to a surface of the substrate, wherein the first component is a solderable material selected from the group consisting of copper, copper alloy and nickel and that has a higher melting point than and is wettable by the solder, and the second component is tin or a tin alloy and that enhances solder flow and that has a lower melting point than the first component that is higher than that of the solder, and wherein the components are formed of discrete particles of the material of each component mixed together and adhered to each other by melting and solidification of at least the surfaces of the particles such that on a microstructural level there are two separately identifiable components to form a cohesive and adhering coating layer.

11. The solderable coating of claim 10 wherein the composite layer of the coating comprises 10–80% by volume of the first component and 20–90% by volume of the second component.

* * * * *